United States Patent [19]

Federlin et al.

[11] Patent Number: 5,572,398

[45] Date of Patent: Nov. 5, 1996

[54] TRI-POLAR ELECTROSTATIC CHUCK

[75] Inventors: Peter Federlin; Lee Chen, both of Austin; D. Rex Wright, Bastrop, all of Tex.

[73] Assignees: Hewlett-Packard Co., Palo Alto, Calif.; International Business Machines, Corp., Armonk, N.Y.; Sematech, Inc., Austin, Tex.

[21] Appl. No.: 338,306

[22] Filed: Nov. 14, 1994

[51] Int. Cl.$^6$ ............................................. H02N 13/00
[52] U.S. Cl. ............................................. 361/234
[58] Field of Search ........................... 361/234; 279/128

[56] References Cited

U.S. PATENT DOCUMENTS 4,384,918  5/1983  Abe ............................... 361/234 X
5,055,964  10/1991  Logan et al. ...................... 361/234
5,099,571  3/1992  Logan et al. ...................... 29/825

*Primary Examiner*—Fritz Fleming
*Attorney, Agent, or Firm*—William W. Kidd

[57] ABSTRACT

A tri-polar electrostatic chuck has both positive and negative electrodes housed on a non-polarized base housing. A non-polarized guard ring surrounds the outer periphery of the chuck and enclosing the electrodes. A wafer is placed atop the chuck with its back-side cooled by a cooling gas that is piped up through the chuck. The edge of the wafer is made to reside over the guard ring, instead of over one of the polarized electrodes. The proximity of the non-polarized guard ring to the wafer edge helps to reduce the amount of plasma leakage around the edge of the wafer, resulting in less breakdown of the dielectric coating of the chuck. The positioning of the electrodes also provides for a uniform impedance across the processing surface of the wafer.

18 Claims, 3 Drawing Sheets

TRI-POLAR ELECTROSTATIC CHUCK

BACKGROUND OF THE INVENTION

1. Field of the Invention

The present invention relates to the field of semiconductor wafer processing and, more particularly, to electrostatic chucks for holding wafers during processing.

2. Prior Art

Electrostatic chucks (ESCs) for use in semiconductor processing tools are well-known in the prior art. A major advantage of such ESCs is the manner in which wafers are held on the chuck. By utilizing DC biased electrodes, electrostatic charges of opposite polarity form in the wafer. The electrostatic force maintains sufficient attraction to retain the wafer proximal to the upper surface of the chuck without the use of mechanical retaining means.

Prior art ESCs are designed so that the main housing of the chuck is of one polarity while an electrode of opposite polarity is made to reside in or on the chuck proximal to the upper surface. A wafer is then placed above the chuck for processing. Although performance is adequate in most instances, two problems are noted with the prior art bi-polar ESCs.

Firstly, since the housing of the chuck functions as an electrode, the impedance across the surface of the chuck is not uniform. This is mainly due to the difference in radio frequency paths to the wafer through both electrodes from the RF source. Secondly, due to the attraction of electrons (or ions) to a polarized electrode, plasma leakage around the edge of the wafer is noticeable, especially when this leakage contributes to the breakdown of the dielectric coating on the chuck. Plasma shaping rings have been utilized to shape the plasma sheath to obtain a more uniform plasma, but have not been successful in preventing this plasma leakage.

The present invention describes an electrostatic chuck that attempts to remove or reduce these shortcomings.

SUMMARY OF THE INVENTION

A tri-polar electrostatic chuck (ESC) for processing semiconductor wafers is described. The ESC is comprised of a base housing that forms a main body of the chuck. A majority of the central portion of the upper surface of the chuck is hollowed to form a recessed surface for housing both positive and negative electrodes. Outer periphery of the chuck is at a raised level to form a concentrically circular guard ring around the outer perimeter of the chuck. A disk shaped positively biased electrode is placed at the center of the chuck in the recessed region. Around this positive electrode is a ring-shaped electrode which is placed in the recessed region between the positive electrode and the guard ring. This second electrode is negatively biased. Since the base unit is not biased by a DC source, the elements of the chuck form a tri-polar design.

The upper surface of the ESC is made planar to accommodate a wafer which is placed thereon. The wafer is positioned above the chuck so that the outer edge of the wafer resides over the guard ring, instead of over a biased electrode. Thus, the edge of the wafer is positioned proximal to the non-polarized base and away from the polarized electrodes. A cooling gas is made to flow between the chuck and the wafer to cool the wafer from its underside.

By utilizing a non-biased housing and guard ring, plasma leakage around the wafer edge is reduced. The non-biased guard ring presents a non-polarized target to the electrons and ions present in the plasma. Due to less of an attraction at the wafer edge, plasma leakage is reduced. The reduction in the plasma leakage around the edge of the wafer contributes to less breakdown of the dielectric coating present on the surface of the chuck.

Additionally, due to the similar positioning of the two electrodes within the recessed region of the chuck housing, impedance from the RF source to the plasma is made substantially uniform over the processing surface of the wafer. Having uniform impedance contributes to more uniform processing of the wafer by the plasma in the reactor.

Although various ESCs of the present invention can be designed, two different chuck embodiments are described in detail. A lower temperature chuck is utilized for plasma etching and is described formed from an anodized metal. An epoxy adhesive is used to bond the electrodes to the base unit. A high temperature chuck is also described in which a dielectric coating is thermal sprayed on to stainless steel. Instead of an adhesive, a crushed-gasket is used. The various pieces are clamped together and then the outer guard ring is spot welded to the base housing.

Economic Advantage:

Ultimately, the practice of the present invention results in lower overall cost of manufacturing devices on wafers, since processing parameters are improved and useful life of the tool is increased.

DETAILED DESCRIPTION OF THE PREFERRED EMBODIMENTS

A tri-polar electrostatic chuck utilized for semiconductor wafer processing is described. In the following description, numerous specific details are set forth, such as specific structures, circuits, material compositions, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

PRIOR ART

Figure 1:
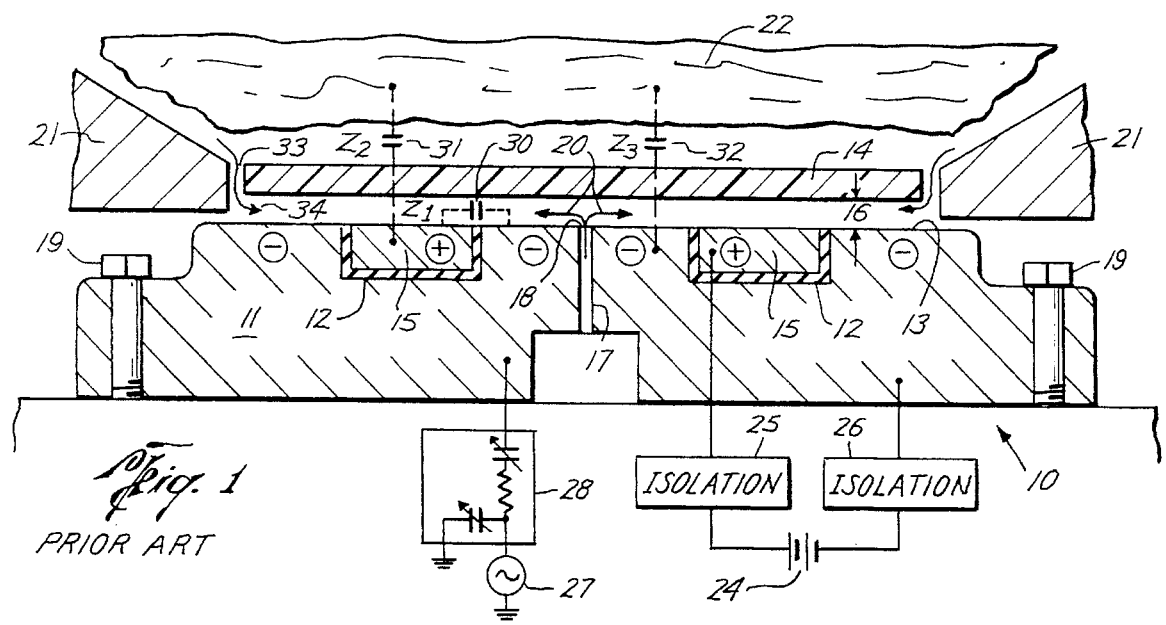
FIG. 1 is a cross-sectional view of a prior art bi-polar electrostatic chuck.
Figure 2:
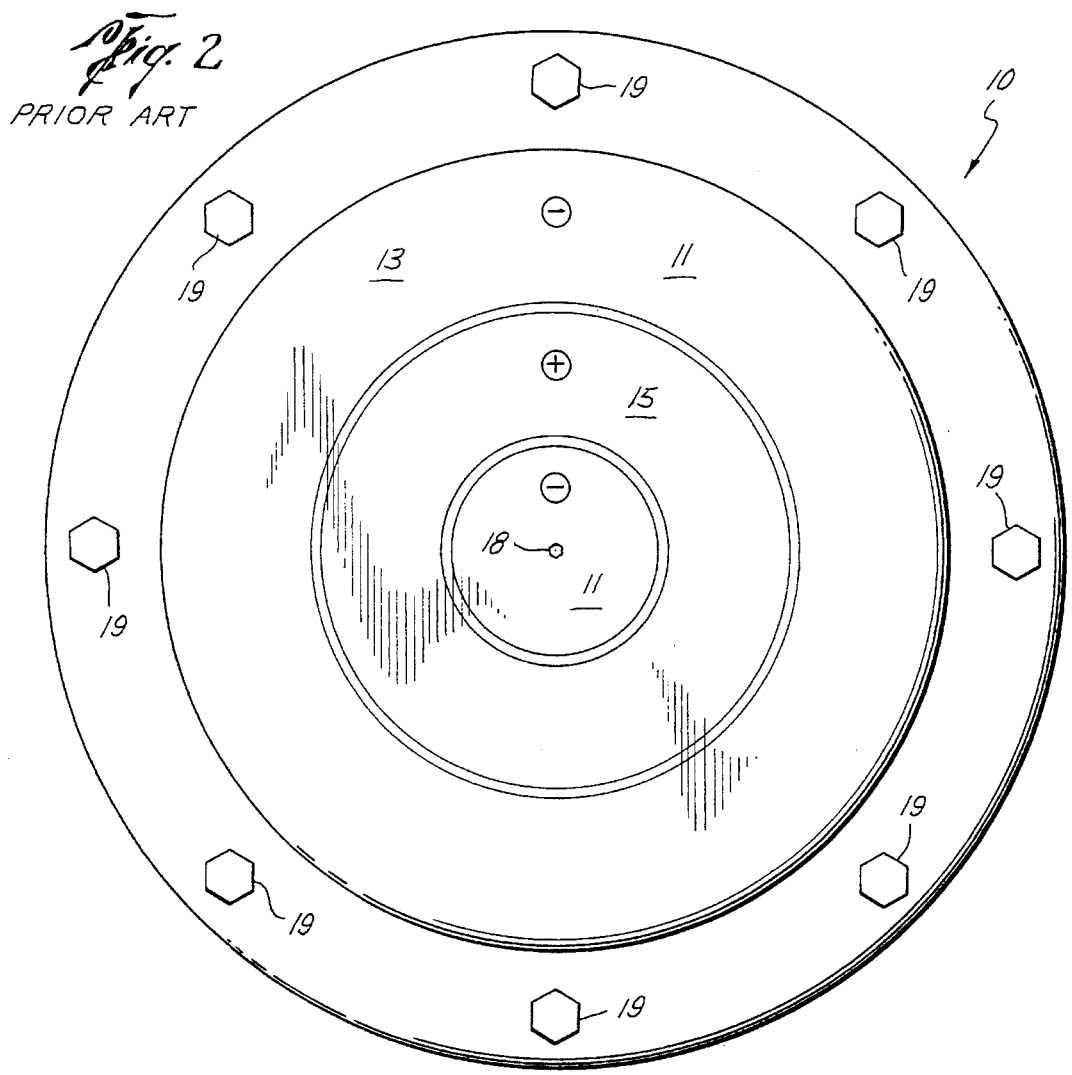
FIG. 2 is a top plan view of the electrostatic chuck of FIG. 1.

Referring to FIG. 1, a typical prior art bi-polar electrostatic chuck (ESC) 10 is shown. ESCs, such as chuck 10, are known in the prior art for use in processing semiconductor wafers, especially silicon wafers. A special property of an ESC is the use of electrostatic force to retain a wafer (or some other material) on the chuck surface or proximal thereto. In operations using plasma gas, many ESCs incorporate features to cool the wafer by flowing inactive gas, such as helium or nitrogen, adjacent to the wafer. Generally, the cooling is achieved by gas flow on the back side (versus the front surface which is exposed to the plasma) and, hence, is termed "back-side" cooling. This cooling gas maintains the temperature of a wafer at a reasonable level during processing of a wafer. Etching of a wafer in a plasma environment is a typical processing step performed by a reactor containing the ESC. It is to be appreciated that a variety of ESC designs are currently in use and that the specific prior art ESC 10 shown is but one simplified example.

ESC 10 is comprised of a base housing 11, which forms the main (or base) element of ESC 10 upon which other components are constructed on or in. Base 11 can be constructed from a single piece of material or can be formed from a number of attached pieces. Most prior art ESCs are made from aluminum, although other metals and ceramics (which have a metallic material encapsulated therein) can be used for constructing the prior art ESC. The ESC is typically circular in shape to accommodate a circular wafer. Generally, some form of fastener is used to attach the base 11 to a fixture (not shown) residing in a reactor (also, not shown). In the specific example of FIG. 1, a plurality of bolts 19 are used to fasten the base to some structure within a reactor. It is to be appreciated that the design, the use of a particular material, and means of fastening the ESC are all a design choice mandated by the tool being utilized and by the particular application for which the ESC is being utilized. These features are important but not critical to the understanding of the present invention.

In the prior art bi-polar ESC 10 of FIG. 1, the base 11 functions as one of two electrodes for providing an electrostatic potential on a wafer 14. A second electrode 15 is constructed within a trench 12 that is formed on an upper surface 13 of chuck 10. The trench 12 is of a predetermined width and thickness and is disposed concentrically to the circular shape of the chuck 10. The shape of the trench 12 is a design choice, but in FIG. 1, trench 12 is shown as a circularly-shaped cut-out with vertical walls on the surface 13.

The second electrode 15, also constructed from a similar material as base 11, is constructed to fit within the trench region 12 and has its upper surface at the same level as surface 13, so that the surface of chuck 10 facing wafer 14 is substantially planar. Electrode 15 is permanently affixed in trench 12 and to base 11 by some fastening means. One preferred approach is to bond electrode 15 within trench 12 by utilizing an epoxy adhesive. It is critical to electrically isolate the two electrodes 11 and 15 from the environment, as well as from each other. The outer surfaces of base 11 and electrode 15 are anodized to isolate the two electrodes. The epoxy adhesive also provides the necessary electrical isolation between the two electrodes 11 and 15.

The wafer 14 is placed onto the upper surface 13 of chuck 10, however, a slight gap 16 will exist between the back-side of the wafer and surface 13. The gap 16 distance is dependent on the surface roughness of the chuck 10 and the underside of the wafer 14, which generally is in the range of 1 to 5 microns. A cooling gas, such as helium (He), nitrogen ($N_2$) or Argon (Ar), is introduced in this gap 16 under pressure to enhance the heat transfer from the wafer to cool the wafer during processing. Generally, He gas is piped through the base 11 by having a channel which opens on the surface 13. In the example, a single opening 18 is shown at the center of the chuck 10, but the number and location of such openings are a design choice. As shown by flow arrows 20, He gas is pumped through channel 17 and out opening 18 to flow outward from the center of the chuck 10. The He gas diffuses toward the periphery of the chuck 10.

Additionally, many prior art ESCs use a plasma shaping (or focus) ring 21 around the edge of the wafer 14. Shaping ring 21 is usually made from a ceramic material in order to withstand the high plasma temperatures and is used for the purpose of shaping the plasma sheath so that the plasma resides above the wafer at an optimal area for processing the wafer 14. The use of such shaping ring 21 is well-known in the art.

In operation, a DC potential of one polarity is coupled to the first electrode, which is the base 11, and a DC potential of an opposite polarity is coupled to the second electrode 15. Although two separate DC supplies could be utilized, the example in FIG. 1 utilizes a single DC supply 24. The negative terminal of the supply 24 is coupled to the base 11, while the positive terminal is coupled to the electrode 15. Typically, AC decoupling (or isolation) circuitry, shown as circuitry 25 and 26, is used to prevent any AC signals from being coupled to the DC supply 24.

The negative and positive potentials at the respective electrodes 11 and 15 are electrostatically coupled to the underside of the wafer, wherein the field sets up charges of opposite polarity along the underside of wafer 14. That is, along the underside of the wafer 14 across gap 16 from the negatively polarized base 11, positive charges are formed. Likewise, along the underside of the wafer 14 across gap 16 from the positively polarized electrode 15, negative charges are formed. Due to the attraction of opposite polarities, the underside of wafer 14 is electrostatically attracted toward the chuck 10 and is maintained in position on chuck 10 by the electrostatic force. The pressured cooling gas between the chuck 10 and wafer 14 functions to enhance the heat transfer from the wafer 14 to chuck 10. It is to be appreciated that the gap 16 shown in FIG. 1 is exaggerated for illustrative purpose and, generally, the gap distance is in the range of 1 to 5 microns, but such gap distance is a design choice dependent considerably on the roughness of the surfaces.

If the processing step being performed on the wafer 14 involves the use of a plasma, plasma 22 formation occurs above the wafer 14, as is shown in FIG. 1. A high power AC source 27 is coupled to the main body of the chuck, which in this instance is base 11, usually through a tuning circuit 28. The frequency of the AC supply 27 is usually in the radio frequency (RF) range. The actual frequency and power output are design choices dependent on the application desired, however, RF sources on the order of 13 MHz and up to 2000 watts are commonly used. The RF source 27 is used for the purpose of attracting the plasma onto the wafer 14. It should be noted that ESCs can also be used for electron cyclotron resonance (ECR) etching as well, in which much higher frequencies are used.

Although the prior art bi-polar chuck 10 performs adequately for various wafer processing applications, there are two shortcomings associated with it. The first problem pertains to non-uniform impedance. The second problem pertains to breakdown of the dielectric coating of the chuck 10 due to plasma bombardment.

In respect to non-uniform impedance, there are two electrical paths noted from the RF source 27 to the plasma 22. One path is from the negative electrode (base 11) to the plasma 22, which has a capacitive coupling illustrated by capacitor 32. The other path is from the positive electrode 15 to the plasma, which has a capacitive coupling illustrated by capacitor 31. However, for this second path there is the dielectric gap between the positive and negative electrodes, which is illustrated by capacitor 30. Thus, there is an impedance Z1 associated with capacitor 30, impedance Z2 associated with capacitor 31 and impedance Z3 associated with capacitor 32. Neglecting any impedance of the tuning circuit 28 or any associated cabling, impedance from the RF source 27 to the plasma 22 by the path of the negative electrode is Z3. However, impedance from the RF source 27 to the plasma 22 by the path of the second electrode is actually Z1+Z2 due to the DC isolation gap between the negative and positive electrodes. For the RF source 27 to "see" uniform impedance across the wafer, Z3 must equal Z1+Z2, which is difficult to achieve due to the multiple interfaces. Thus, the AC path from the RF source 27 to the plasma 22 by the second (positive) electrode 15 requires the AC signal to traverse the negative-positive gap. Because of the extended length of one path over the other and the additional interface, uniformity of impedance across the surface of the wafer is difficult to achieve. This impedance variation can result in non-uniform processing of the wafer.

In respect to the problem encountered by the breakdown of the dielectric coating, it is noted that a gap 33 exists between the wafer 14 edge and shaping ring 21. It is through this gap 33 that plasma leakage occurs. The plasma 22 is comprised of free electrons (negatively charged) and positively charged ions. It is preferred that these charged particles remain in the region above the wafer. However because of the gap 33, charged particles tend to pass through this gap 33 and impinge on to chuck 10. Due to the DC electrode potential, correspondingly opposite charges are accelerated toward the polarized electrode(s). The accelerated particles bombard the surface of chuck 10 causing breakdown of the dielectric coating.

This particle acceleration and dielectric breakdown is especially noticeable near the gap 33, as shown by leakage path 34. The proximity of having a polarized electrode (in this example, the electrode is a negatively biased base 11) near gap 33, attracts and accelerates particles toward the electrode surface near the gap 33. In the example, positive ions travel through the gap to bombard base 11. As the ions bombard the surface of base 11, the ions etch away the dielectric coating covering base 11. Typically, the dielectric coating is an anodized coating, which erodes as it is etched away. It has been observed that the erosion of the anodized coating can be concentrated to a single point or a small area adjacent to gap 33. Once breakdown of the anodized coating occurs (even at a single point), arcing from the plasma to the metallic material of the chuck is imminent. Any arcing will disrupt the on-going process, but worse, could result in destroying the wafer. Thus, because of the plasma leakage 34 through gap 33, the useful life of chuck 10 is limited, mainly due to the breakdown of the dielectric coating at the outer edge of the chuck 10 near gap 33.

PRESENT INVENTION

Figure 3:
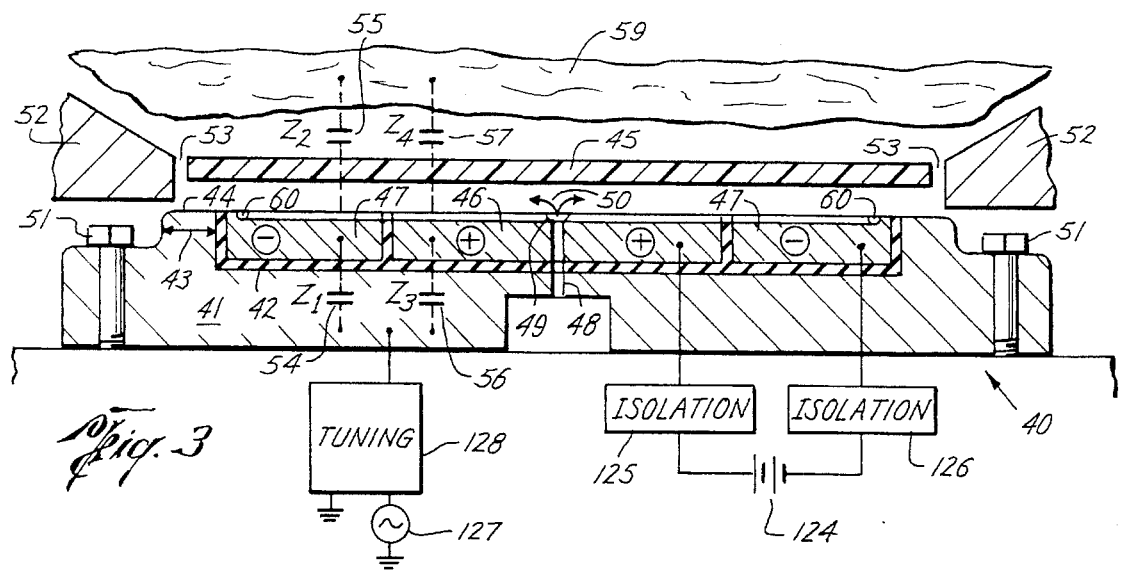
FIG. 3 is a cross-sectional view of an electrostatic chuck of the present invention.
Figure 4:
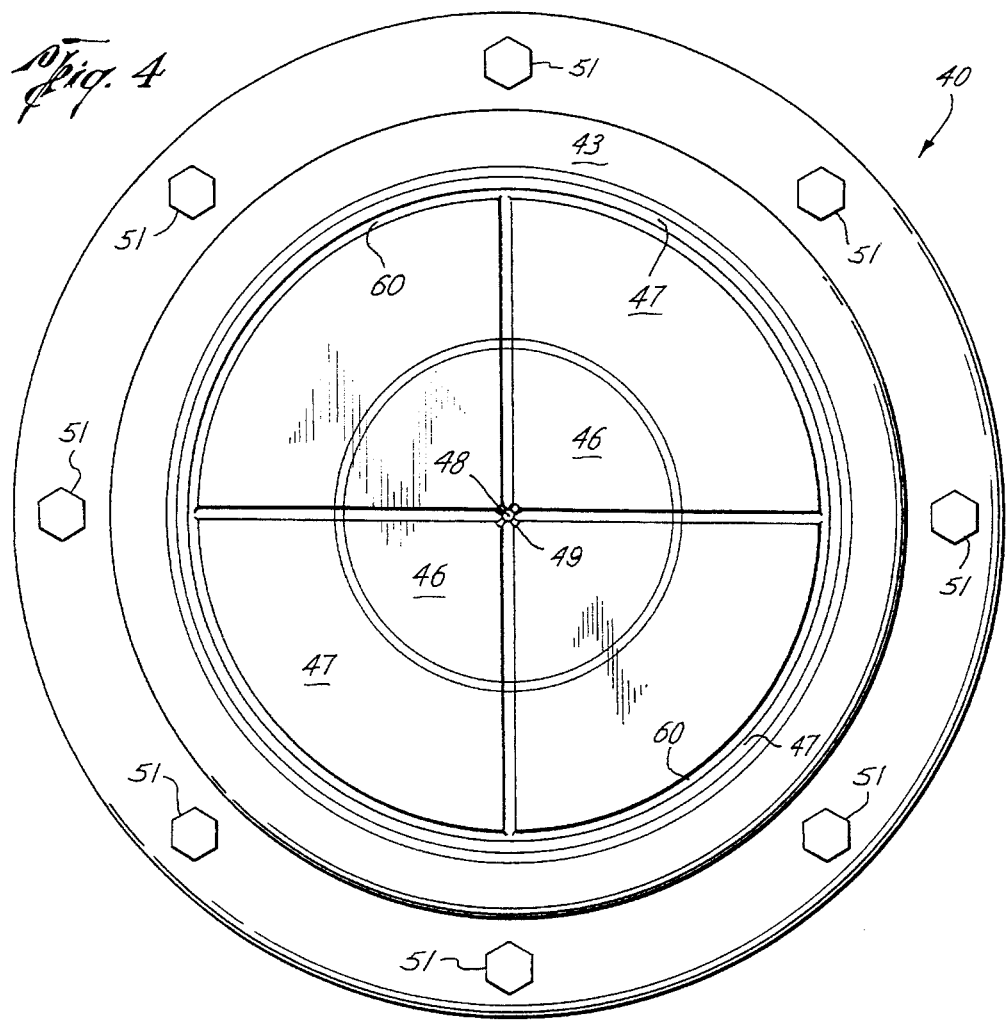
FIG. 4 is a top plan view of the electrostatic chuck of FIG. 4.

Referring to FIGS. 3 and 4, an electrostatic chuck (ESC) 40 of the present invention is shown. Chuck 40 is comprised of a base housing 41, which comprises the main housing for chuck 40, and two separate polarized electrodes 46 and 47. The base 41 is similar in construction to the prior art base 11, but has a recessed trench 42 which is sizably larger than the trench 12 of the prior art ESC 10. Essentially, the upper surface of the chuck 40 has substantially most of its surface from the center outward recessed so that a raised surface 44 is formed along the periphery of chuck 40. Describing this structure alternatively, a raised guard ring 43 is formed concentrically around the outer edge of the upper surface of chuck 40, wherein the area interior to the guard ring 43 is recessed below the level of surface 44. It is within this lower surface (trench 42) that the two electrodes 46 and 47 are placed.

As with the prior art, base 41 is fastened to a structure in a tool by some means, such as bolts 51 located outward of guard ring 43. As noted earlier, the type and location of such fastener is a design choice. For example, bolts or screws can be made to mount into base 41 from the underside of base 41. Also, as with the prior art, a wafer 45 is made to reside above chuck 40, fully encompassed by a concentrically surrounding plasma shaping ring 52. The spacing between wafer 45 and shaping (or focus) ring 52 is noted as gap 53. When operating in a plasma tool, a plasma 59 is formed above the wafer 45.

Although the placement of the wafer 45 and the shaping ring 52 are similar to that of the prior art chuck 10, it should be stressed that the interior edge of the shaping ring 52 is located proximal to guard ring 43. The diameter of the chuck 40 and the location of guard ring 43 should be such, so that the outer periphery of wafer 45 is proximally positioned above surface 44 of guard ring 43. By proper sizing and placement, guard ring 43 should be nearer to gap 53 than electrodes 46–47.

A significant difference between the ESC 40 of the present invention to the prior art ESC 10 is in the placement of the electrodes. Unlike ESC 10, the base 41 does not function as a polarized electrode. Instead, both positive and negative electrodes are positioned within the recessed area 42. The interior electrode 46 (noted as the positive electrode in FIG. 3) is a circularly formed disk residing at the center of chuck 40. The second electrode 47 (noted as the negative electrode in FIG. 3) resides outwardly from electrode 46. Electrode 47 is concentrically circular with the chuck 40, but is ring-shaped to fit around electrode 46. That is, electrode 47 is shaped to fit in the trench 42 between electrode 46 and guard ring 43. The thickness of the two electrodes 46 and 47 should be such that the upper operating surface of chuck 40, formed by the upper surfaces of guard ring 44 and electrodes 46–47, should be substantially planar.

As with the prior art electrode, some means must be used to affix electrodes 46–47 onto the base 41. However in this instance each of the three elements 41, 46 and 47 must be kept electrically isolated from the other two. Generally, a dielectric coating, such as an anodized coating, is formed on components 41, 46–47 to provide the electrical isolation. Again, some form of epoxy adhesive will function to adhere electrodes 46–47 onto base 41, while at the same time aiding in electrically isolating them. Although the epoxy adhesive is preferred in the gap between the two electrodes 46 and 47 to bond them and also to additionally provide electrical isolation of one electrode from the other, it is not necessarily needed. Other means of retaining the electrodes 46–47 can be readily used. An RF source 127, tuning circuit 128, DC bias supply 124 and decoupling circuits 125 and 126 (equivalent to like units 24–28 associated with the prior art ESC 10) are also utilized with the ESC 40. The RF source 127 is coupled to base 41 through tuning circuit 128. The positive terminal of the DC bias supply 124 is coupled to the positive electrode 46 through decoupling circuit 125. However, unlike the prior art, the negative terminal of the DC supply 124 is coupled to the negative electrode 47 through decoupling circuit 126.

It is to be noted that the DC supply 124 is not coupled to the base 41. Thus, polarization potentials are placed on the two electrodes 46–47 located interior to the guard ring 43. Although DC potential may be induced in the main housing 41 of the chuck 40 during operation, the base does not function as a polarized electrode. The base 41 functions by equivalence to a conventional reactor electrode and not as a polarized electrode. The two polarized electrodes 46–47 and the non-polarized base 41 provide for a tri-polar (positive bias, negative bias and non-biased) chuck with the advantages noted below. It should be noted that the two electrodes 46–47 provide the electrostatic force to hold the wafer 45 on chuck 40.

Capacitors 54–57 exemplify the coupling across the non-conductive junctions between the RF source 127 and plasma 59. Impedance Z1 (illustrated by capacitor 54) is the impedance between base 41 and electrode 47. Impedance Z2 (illustrated by capacitor 55) is the impedance between electrode 47 and plasma 59. Impedance Z3 (illustrated by capacitor 56) is the impedance between base 41 and electrode 46. Impedance Z4 (illustrated by capacitor 57) is the impedance between the electrode 46 and plasma 59. One electrical path from RF source 127 to plasma 59 is through base 41 and electrode 47, while the second path is through base 41 and electrode 46.

It is to be appreciated that the impedance through both paths can be made substantially the same if the impedances of the two electrodes 46–47 are made substantially the same. This is because the couplings noted by capacitors 54 and 56 are essentially identical, as are the couplings of capacitors 55 and 57. Since, Z1=Z3 and Z2=Z4, it follows that Z1+Z2= Z3+Z4, provided that electrodes 46 and 47 have essentially the same impedance characteristic. Generally, electrodes 46 and 47 can be readily designed to have the same impedance characteristic by making the two electrodes from the same material and having the same thickness and surface area. Since the electrodes will be made to fit within the same trench region, the thicknesses will be the same. Thus, by simply controlling a single parameter (surface area of the electrode), the ESC 40 can be made to have a uniform impedance across the surface of the wafer 45, which will permit a more uniform processing of the wafer to be achieved. It should be mentioned that the region above the guard ring 43 may not have the same impedance. However, with proper dimensions for the ESC 40, the guard ring 43 is made to reside under the peripheral region of the wafer where no devices are fabricated.

Another advantage is in having a non-biased guard ring 43 nearest the gap 53, versus a negatively polarized electrode of the prior art chuck 10. Since the guard ring 43 is not DC biased, electrons or ions are attracted less in comparison to the prior art ESC 10. This results in less plasma leakage occurring through gap 53. Less plasma leakage results in less bombardment and less chance of a breakdown of the dielectric coating of chuck 40. This then increases the useful life of the ESC 40 and also can prevent sudden failures due to "point" arcing in a reactor tool.

It should be noted that the polarity of electrodes 46 and 47 could be reversed. However, the preferred approach is to make the outer ring electrode 47 negative. Since electrons are more mobile than positive ions, it is believed that having an attraction for positive ions by the proximity of the negatively charged electrode being adjacent to guard ring 43 (versus an attraction for faster moving electrons if the outer electrode is made positive), provides for the least amount of plasma leakage and particle acceleration at the gap 53.

The preferred embodiment described above makes reference to negative and positive electrodes. However, in actual use, what is important is that the two separate electrodes 46 and 47 have different bias voltages. Both electrodes 46–47 can be positively biased or both can be negatively biased. That is, electrode 46 can be biased by a negative voltage, while electrode 47 can also be biased by a negative voltage but of a higher negative potential. Thus, the polarities noted in reference to the drawings are relative potential differences between the electrodes.

It is to be appreciated that several other features are noted in reference to the ESC 40, but are not necessarily critical to the practice of the present invention. A central channel 48 couples a cooling gas, such as helium, to an opening 49 for distributing the cooling gas to the underside of wafer 45, as is shown by arrows 50. It is desirable to have this back-side cooling, but how and where it is delivered is a design choice. In the particular example, channel 48 is centrally located and a corresponding channel and opening 50 is formed through electrode 46. Essentially, a hole is drilled through the center of electrode 46. Again, opening(s) can be made elsewhere on the chuck. The number and location of such opening(s) is/are a design choice.

In the ESC 40 of the present invention, two crisscrossing grooves are cut to form intersecting diameters to assist in channeling the cooling gas toward the periphery of the chuck. Also noted on the upper surface of electrode 47 is a concentrically cut groove 60 which resides a short distance, approximately in the range of 30 mils inwardly from the outer edge of electrode 47. The circular groove 60, located near the outer edge of chuck 40, ensures that the cooling gas is distributed underneath the whole of the wafer to prevent "hot spots" from developing on the wafer.

As noted in the drawings, the guard ring 43 is not polarized. It is possible that the wafer edge above the guard ring 43 may lift slightly due to this lack of polarizing potential. However, by having proper flow of the cooling gas and ensuring that the pressure of the cooling gas at the outer edges is maintained minimally, the wafer 45 will remain on or proximal to the chuck surface. Groove design can be used as one method of controlling the cooling gas pressure at the edge.

It is appreciated that the ESC 40 of the present invention is described in reference to a chuck which is utilized for etching in a plasma environment. As such, the chuck (including the electrodes) is typically made from aluminum and anodized to form the dielectric coating. However, other materials can be readily used for the base 41 and the electrodes 46–47. Without limiting the invention, other material examples for the chuck and the electrodes 46–47 are titanium, nickel titanium, niobium titanium, tantalum, molybdenum, vanadium, zirconium and alloys such as stainless steel, hasalloy™, timken™ and kanthal™.

Some examples of dielectric coatings are, anodic coatings, thermally-sprayed ceramics and ceramic coatings deposited by HVOF (high velocity oxy fuel) spray technique. An epoxy adhesive is one preferred means of bonding the electrodes, but other means can be used, such as ceramic cement or by braising alloys. The type of material used, the dielectric coating and means for affixing the electrodes are a design choice driven mainly by cost and the process temperatures that are encountered. In etching operations, where temperatures are in the range of −50° to +85°, anodized aluminum and epoxy adhesives work quite well. However, if higher temperatures are to be encountered, then certain design changes are necessary.

Figure 5:
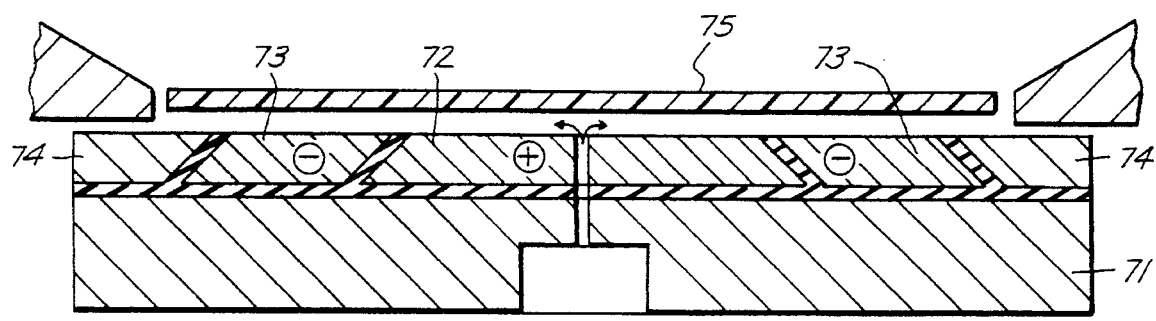
FIG. 5 is a cross-sectional view of an alternative embodiment of an electrostatic chuck for use in high temperature applications.

Referring to FIG. 5, an alternative embodiment of the present invention is shown. ESC 70 is functionally equivalent to the earlier described ESC 40, but the manner in which it is constructed is different. ESC 70 is comprised of a non-biased base housing 71, centrally located positive electrode 72, an outer negative electrode 73 and a guard ring 74 disposed around the outer electrode 73. A wafer 75 resides above the chuck assembly with the outer edge of the wafer 75 positioned above the guard ring 74. Backside cooling is also provided.

ESC 70 is constructed for higher temperature environments which are generally encountered during deposition or sputtering processes. Temperatures in excess of 500° C. are typically encountered. Since aluminum and most epoxy adhesives deform or melt at these temperatures, a different ESC construction is needed. ESC 70 is constructed from metals or alloys (noted earlier) that can withstand the higher temperatures. Since anodic coatings may not withstand this higher temperature, some other heat resistive dielectric coating is desired. One such coating is obtained from thermal spraying alumina ($Al_2O_3$), but other coatings can be readily used as well.

The structural differences of ESC 70 to ESC 40 is noted in FIG. 5. The sides of the electrodes 72–73, as well as the side of the guard ring 74, are slanted toward the center. The guard ring 74 above the planar surface of the base 71 is made a separate unit. When constructed, a gasket, such as a "crush-type" gasket is placed between the slanted surfaces of the sides of the electrodes 72–73 and guard ring 74. These units 72–74 are tightly clamped together and held in place. Then the clamped upper units are further clamped on to a "crush-type" gasket residing on the upper surface of base 71. While so clamped, the side clamps are tightened to force units 72–74 toward the center. The slanted edges will aid in placing a radial force to physically keep the units together, as well as a downward force to retain them tightly against base 71. Then, the guard ring 74 is spot welded to the base 71 along its outer perimeter. When completed, the clamps are removed. The construction of ESC 70 is a concern, but one of the main requirements is the ability of ESC 70 to operate in a higher temperature environment. As such, the material composition of the chuck 70, the dielectric coating of the chuck and any bonding (or other means of affixing the electrodes on to the body of the chuck) must be able to withstand the higher temperatures encountered in a particular tool. As was noted with ESC 40, the electrodes 72 and 73 can be biased having the same polarity. What is important is that there be a potential difference between the two electrodes 72 and 73.

Thus, a tri-polar ESC of the present invention is described. It is appreciated that a variety of different manufacturing techniques are available for constructing the tri-polar ESCs of the present invention. The type, as well as the material and manner of construction, are a design choice, but will be dictated by the application for which it will be used. Furthermore, it is appreciated that the name "tri-polar" is used to describe the three-potential nature of the ESC of the present invention, but that only the electrodes are polarized and the base housing unit is non-polarized. Finally, the present invention was conceived for the purpose of processing silicon wafers, but can be extended to other semiconductors as well.

We claim:

1. An electrostatic chuck (ESC) for electrostatically retaining a semiconductor wafer disposed thereon comprising:

a base housing for forming a main support body to support said semiconductor wafer which resides thereon, said housing having an electrically isolated polarized region disposed on or in its upper surface but interior to its outer perimeter, such that said outer perimeter of said base housing is not biased by a polarizing potential;

a first polarized electrode biased by a first polarizing potential and disposed within said polarized region, but electrically isolated from said base housing;

a second polarized electrode biased by a second polarizing potential and disposed within said polarized region, but electrically isolated from said base housing and said first polarized electrode;

such that when said semiconductor wafer is disposed above said base housing, first and second polarized electrodes, said first and second polarized electrodes electrostatically retain said semiconductor wafer thereon; wherein an impedance measured from said base housing through said first polarized electrode to a processing gas used to process said semiconductor wafer is substantially equivalent to an impedance measured from said base housing through said second polarized electrode to said processing gas, in order to provide for uniform impedance across said semiconductor wafer during processing;

and wherein periphery of said semiconductor wafer resides proximal to said outer perimeter of said base housing in order to reduce attraction of charged particles of said processing gas from traversing around said semiconductor wafer, so as to inhibit bombardment of said base housing and said two polarized electrodes by said charged particles.

2. The ESC of claim 1 wherein said second polarizing potential is opposite in polarity from said first polarizing potential.

3. The ESC of claim 2 wherein said base housing is circularly shaped to accommodate a circular wafer and said first and second polarized electrodes are also circularly shaped.

4. The ESC of claim 3 wherein said first polarized electrode is disk-shaped and is disposed centrally at a center of said base housing and said second polarized electrode is ring shaped and is disposed between said first polarized electrode and said outer perimeter of said base housing.

5. The ESC of claim 4 wherein said first and second polarized electrodes have the same thickness and same surface area in order to provide for substantially equivalent impedance.

6. The ESC of claim 5 wherein a cooling gas is piped through said base housing to said semiconductor wafer in order to cool said semiconductor wafer.

7. The ESC of claim 6 wherein vertical sides of said electrodes have a slanted surface such that a physical force exerted inward from said outer perimeter onto said electrodes causes said slanted surface to exert a downward retaining force to retain said two polarized electrodes upon said base housing.

8. An electrostatic chuck (ESC) for electrostatically retaining a semiconductor wafer disposed thereon comprising:

a base housing for forming a main support body to support said semiconductor wafer which resides thereon, said housing having a recessed region disposed on its upper surface but interior to its outer perimeter, such that said outer perimeter of said base housing has a surface level above said recessed region and is not biased by a polarizing potential;

a first polarized electrode biased by a first polarizing potential and disposed within said recessed region, but electrically isolated from said base housing;

a second polarized electrode biased by a second polarizing potential and disposed within said recessed region, but electrically isolated from said base housing and said first polarized electrode;

such that when said semiconductor wafer is disposed above said base housing, first and second polarized electrodes, said first and second polarized electrodes electrostatically retain said semiconductor wafer thereon;

wherein an impedance measured from said base housing through said first polarized electrode to a processing plasma used to process said semiconductor wafer is substantially equivalent to an impedance measured from said base housing through said second polarized electrode to said processing plasma, in order to provide for uniform impedance across said semiconductor wafer during processing;

and wherein periphery of said semiconductor wafer resides proximal to said outer perimeter of said base housing in order to reduce attraction of charged particles of said processing plasma from traversing around said periphery of said semiconductor wafer, so as to inhibit bombardment of said base housing and said polarized electrodes by said charged particles.

9. The ESC of claim 8 wherein said second polarizing potential is opposite in polarity from said polarizing potential.

10. The ESC of claim 9 wherein said base housing is circularly shaped to accommodate a circular wafer said first and second polarized electrodes are also circularly shaped.

11. The ESC of claim 10 wherein said first polarized electrode is disk-shaped and is disposed centrally at a center of said base housing and said second polarized electrode is ring shaped and is disposed between said first polarized electrode and said outer perimeter of said base housing.

12. The ESC of claim 11 wherein said first and second polarized electrodes have the same thickness and same surface area in order to provide for substantially equivalent impedance.

13. The ESC of claim 12 wherein a cooling gas is piped through said base housing to said semiconductor wafer in order to cool said semiconductor wafer.

14. The ESC of claim 13 wherein said first polarized electrode is positive in polarity and said second polarized electrode is negative in polarity.

15. The ESC of claim 14 wherein vertical sides of said two polarized electrodes have a slanted surface such that a physical force exerted inward from said outer perimeter onto said electrodes causes said slanted surface to exert a downward retaining force to retain said two polarized electrodes upon said base housing.

16. A method of processing a semiconductor wafer by placing said semiconductor wafer on an electrostatic chuck, wherein an electrostatic force retains said wafer on said chuck, comprising the steps of:

providing an electrostatic chuck having a base housing which forms a main support body to support said wafer, said housing having an electrically isolated polarized region disposed on or in its upper surface but interior to its outer perimeter, such that said outer perimeter of said base housing is not biased by a polarizing potential;

said chuck having a first polarized electrode disposed within said polarized region and electrically isolated from said base housing;

said chuck also having a second polarized electrode disposed within said polarized region and electrically isolated from said base housing and said first polarized electrode;

coupling a first polarizing potential to said first polarized electrode and coupling a second polarizing potential to said second polarized electrode, but not coupling either of said polarizing potentials to said base housing;

coupling an AC source to said base housing to attract charged particles present in a processing gas to said semiconductor wafer disposed on said chuck;

said first and second polarized electrodes, being disposed adjacent to each other and within said polarized region, provide for substantially equivalent impedance when measured from said base housing through either said first polarized electrode or said second polarized electrode to said processing gas, so as to provide for uniform impedance across said semiconductor wafer during processing;

and wherein periphery of said semiconductor wafer resides proximal to said outer perimeter of said base housing in order to reduce attraction of charged particles of said processing gas from traversing around said semiconductor wafer, so as to inhibit bombardment of said base housing and said two polarized electrodes by said charged particles.

17. The method of claim 16 wherein said first polarizing potential is of a first polarity and said second polarizing potential is of an opposite polarity.

18. The method of claim 17 wherein said semiconductor wafer is a silicon wafer.

* * * * *

UNITED STATES PATENT AND TRADEMARK OFFICE
CERTIFICATE OF CORRECTION

PATENT NO : 5,572,398

DATED : November 5, 1996

INVENTOR(S): Peter Federlin, Lee Chen, and D. Rex Wright

It is certified that error appears in the above-identified patent and that said Letters Patent is hereby corrected as shown below:

Title page, item [73] Assignee:
"International Business Machines, Corp." should be
--International Business Machines, Corporation--.

Signed and Sealed this

Second Day of September, 1997

*Attest:*

BRUCE LEHMAN

*Attesting Officer*  *Commissioner of Patents and Trademarks*